United States Patent [19]

Chance et al.

[11] Patent Number: 4,555,285
[45] Date of Patent: Nov. 26, 1985

[54] FORMING PATTERNS IN METALLIC OR CERAMIC SUBSTRATES

[75] Inventors: Dudley A. Chance, Danbury; Timothy C. Reiley, Ridgefield, both of Conn.; Michael Sampogna, Fishkill, N.Y.

[73] Assignee: International Business Machines Corporation, Armonk, N.Y.

[21] Appl. No.: 561,373

[22] Filed: Dec. 14, 1983

[51] Int. Cl.⁴ ............................................. C04B 37/00
[52] U.S. Cl. ....................................... 156/89; 156/230; 156/272.2; 430/256; 430/260; 430/271; 430/311
[58] Field of Search ................. 156/89, 230, 272.2; 430/256, 260, 271, 311, 319; 428/110

[56] References Cited

U.S. PATENT DOCUMENTS

| 3,215,575 | 11/1965 | Göbel | 156/89 |
| 3,469,982 | 9/1969 | Celeste | 430/256 |
| 3,526,504 | 9/1970 | Celeste | 430/271 |
| 3,614,834 | 10/1971 | Chance et al. | 29/626 |
| 3,615,980 | 10/1971 | Schuck | 156/89 |
| 3,948,706 | 4/1976 | Schmeckenbecher | 156/89 |
| 3,984,244 | 10/1976 | Collier et al. | 156/230 |
| 4,119,480 | 10/1978 | Nishi et al. | 156/272.2 |
| 4,234,673 | 11/1980 | Scrutton et al. | 156/230 |
| 4,353,957 | 10/1982 | Rutt et al. | 428/110 |
| 4,405,394 | 9/1983 | Cohen | 156/64 |

Primary Examiner—Caleb Weston
Attorney, Agent, or Firm—Pollock, Vande Sande & Priddy

[57] ABSTRACT

A method for forming a pattern in a metallic and/or ceramic substrate by laminating together the substrate which is in the green stage and a composite of a photosensitive material and a backing wherein the photosensitive material has been developed into the desired pattern, and then subjecting the substrate to elevated temperatures in order to cause sintering of the substrate and removal of the photosensitive material, thereby resulting in embedding of the pattern into the sintered substrate.

20 Claims, 16 Drawing Figures

FORMING PATTERNS IN METALLIC OR CERAMIC SUBSTRATES

DESCRIPTION

1. Technical Field

The present invention is concerned with a method for forming a pattern in a metallic or ceramic substrate. In particular, the present invention is concerned with patterns in metallic or ceramic substrates wherein at least the width or the length of lines of the pattern is 2 mils or less. For instance, fan-out lines in and/or on multilayer ceramic substrates and dielectric isolation for print heads are readily provided by the process of the present invention. Fan-out lines refer to conductive lines which lead from a dense grid of contact lines to a relatively coarse grid.

2. Background Art

In the manufacture of multilayer ceramic (MLC) modules for interconnecting electronic circuit chips and especially large scale integrated electronic circuit chips (LSI), circuit lines are provided by screening techniques. However, these currently practiced screening techniques are limited to providing lines greater than about 3 mils (0.075 mm) wide. Moreover, isolation areas between conductive areas are also limited to separation distances greater than about 3 mils. However, recent high-performance module designs require much smaller or thinner lines for fan-out patterns due to the much denser chip, I/O (input/output) matrix. Since current processes for forming multilayer ceramics can not satisfy this requirement, it has been proposed to provide thin film layers and lines as the top surface on the multilayer ceramic modules.

The thin film layers; however, require planarization of the ceramic substrate which is a very costly and time-consuming procedure. Moreover, the thin film layers require one layer of organic or inorganic dielectric. Such dielectric contains holes or vias passing therethrough which can not be made with current silicon technology. In addition, such thin film layers require means whereby shorts and opens can be repaired due to their high probability in the large area of the substrate. Accordingly, providing such thin film layers along with the types of substrates required for multilayer ceramic modules is quite difficult and poses many technical problems.

Moreover, in the fabrication of devices such as multilayer ceramic print heads, it is necessary to provide dielectric isolation around conductive regions. In addition, the materials employed for such devices must be extremely hard and corrosion resistant. There is a desire to be able to produce isolation for such devices which is as small in size as possible. It has been proposed to fabricate multilayer ceramic print heads using $RuO_2$ for the conductive areas. However, the presently practiced multilayer ceramic technology does not readily lend itself to providing gap isolation therein of 2 mils or less, as desired.

An example of a suggestion for preparing a multilayer ceramic matrix can be found in U.S. Pat. No. 4,353,957 to Rutt, et al. Such suggests forming a monolithic capacitor by providing a plurality of thin ceramic sheets bonded with a thermally-fugitive temporary bond, firing the body to remove the thermally-fugitive material, and sintering the ceramic material, resulting in this spaces between the layers. After this, a liquid metal is introduced into the spaces formed in the multilayer ceramic capacitor.

Also of interest is U.S. Pat. No. 3,247,573 to Noack, which suggests forming a mask by applying a photoresist to a metal sheet of a metallic alloy. The removable mask is then applied to a substrate and a paste of conductive powder and a vehicle is forced through the mask onto the substrate. Next, particles of ferrite for forming green ferrite material are applied to the surface of the mask and the paste and the surplus is scraped away. Then the mask is removed and the remaining materials are heated to sinter the green ferrite and metal and drive off the vehicle.

Also of interest, with respect to photosensitive materials and their use, is U.S. Pat. No. 3,653,898 to Shaw.

SUMMARY OF INVENTION

The present invention is concerned with a method for forming a pattern in a metallic or ceramic substrate. In particular, the process of the present invention makes it possible to provide extremely fine and thin lines, such as less than about 2 mils. Moreover, the process of the present invention is applicable for providing such fine lines in multilayer ceramic modules of the type referred to hereinabove.

The process of the present invention includes providing a composite of a layer of photosensitive material onto a backing or carrier material. The photosensitive material is exposed to actinic radiation in a predetermined pattern and then developed to provide the predetermined pattern on the backing. Next, the composite is laminated together with a substrate which is in the green stage and which contains metallic and/or ceramic particles. The developed photosensitive side of the composite confronts the surface of the substrate. The substrate is then subjected to elevated temperatures sufficient to cause sintering of the metallic and/or ceramic particles of the substrate and removal of the photosensitive material, thereby resulting in embedding the pattern from the photosensitive material into the sintered metallic and/or ceramic substrate.

BEST AND VARIOUS MODES FOR CARRYING OUT INVENTION

Figure 1:
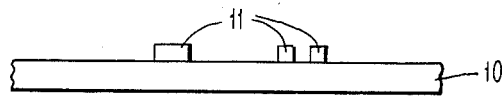
FIGS. 1–5 are cross-sectional views of multilayer ceramic substrate in various stages of fabrication in accordance with the process of the present invention.

The process of the present invention makes it possible to provide extremely thin lines in ceramic and/or metallic substrates and preferably in multilayer ceramic modules. Lines wherein at least the width and/or length thereof is 2 mils or less and preferably 1 mil or less are readily achieved by the present invention. The objectives of the present invention are obtained by utilization of photosensitive materials as embossing means. The present invention includes providing a composite of a layer of photosensitive material on a backing or support. The photosensitive material can be a positive photosensitive material or a negative photosensitive material. A positive photosensitive material is one which upon exposure to actinic radiation is capable of being rendered soluble in a solvent in which the unexposed resist is not soluble. A negative photosensitive material is one which is capable of polymerizing and insolubilizing upon exposure to actinic radiation.

Examples of some photosensitive materials which can be employed according to the present invention include negative or photohardenable polymerizable compositions of the type suggested in U.S. Pat. Nos. 3,469,982; 3,526,504; and 3,448,089, disclosures of which are incorporated herein by reference. Polymers of methylmethacrylate with glycidyl acrylate and/or pentaerythitol triacrylate are known negative photosensitive materials.

Examples of some positive photosensitive materials employed according to the present invention are from copolymers of methylmethacrylate and another acrylate or methacrylate monoester.

An example of another type of photosensitive material is based upon phenol-formaldehyde novalak polymers. A particular example of such is Shipley AZ1350 which is an m-cresol formaldehyde novalak polymer composition. Such is a positive resist composition and includes therein a diazoketone such as 2-diazo-1-naphthol-5-sulphonic acid ester. In such a composition, the orthodiazoketone, during the photochemical reaction, is converted to a carboxylic acid. This, in turn, converts a neutral-organic soluble molecule (the phenolic polymer) to one that is readily soluble in weakly alkali aqueous developer solvents. The composition usually contains about 15% or so, by weight, of the diazoketone compound.

A discussion of various photosensitive materials can be found, for instance, in *Journal of the Electrochemical Society*, Vol. 125, No. 3, March 1980, Deckert, et al., "Microlithography-Key to Solid-State Fabrication", pp. 45C–56C, disclosure of which is incorporated herein by reference.

The photosensitive material is coated onto a backing or support and preferably onto a removable backing. The thickness of the photosensitive material on the backing is preferably not much less than the width of the pattern to be embedded. Suitable thicknesses are from about 0.5 to about 3 mils.

The support backing or film can be selected from a wide variety of materials and preferably high polymeric material such as polyamides, polyolefins, polyimides, polyesters, vinyl polymers, and cellulose esters. If exposure to the actinic radiation is to be made through the back of the support, then such must transmit a substantial fraction of the actinic radiation incident upon it. A particularly suitable film is a transparent polyethylene terephthalate film which is available under the trade designation Mylar.

The photosensitive material is then exposed to actinic radiation in the desired pattern and then developed. When the photosensitive material is a positive resist, the exposed material is removed by a solvent whereas, when the photosensitive material is a negative resist, the unexposed portion is removed by a suitable solvent. For instance, negative photosensitive films from methylmethacrylate polymers such as Riston are readily removed by 1,1,1 trichloroethane.

Since the methods of exposing and developing both positive and negative photoresists are well-known in the art, such need not be described herein in any great detail. After development of the photosensitive material to provide the desired pattern on the backing, such is laminated together with the substrate which is in the green stage. The substrate contains metallic particles or ceramic particles, or combinations thereof. It is understood that combinations of metallic particles and ceramic particles include mixtures of metallic particles and ceramic particles as well as alloys of metallic particles and ceramic particles such as cermet particles.

The green stage refers to sheets of the ceramic and/or metallic particles and/or combinations thereof, bonded by a thermally-fugitive bonding material such as a synthetic polymer or cellulose derivative. The bonding material, upon exposure of the composition to temperatures necessary to sinter the particles, is volatilized and removed. In other words, the green stage refers to the material prior to sintering of the ceramic, and/or metallic, and/or combinations thereof such as cermet particles.

The preferred substrates are ceramic-containing substrates. A ceramic is a product or material which can be manufactured by the action of heat on earthy raw materials. The preferred ceramic substrates include silicon oxides and silicates such as aluminum silicate, and aluminum oxides. A cermet refers to a product containing a mixture of ceramic and metallic components having physical properties not normally found solely in either one alone.

When employing multilayer ceramic products, the thicknesses of each of the layers after sintering is about 4 to about 15 mils.

Preferred ceramic materials include aluminum oxides, various glass materials including glass frit and calcia-silicamagnesia glasses. Examples of some preferred substrates in the green stage include compositions containing about 8 to 25% by weight and preferably about 12 to 16% by weight of an organic binder with the remainder being the ceramic and/or metal containing particles, and/or combinations thereof. The binder preferably includes a polymer such as polyvinylbutyral and/or a polyimide along with a plasticizer such as phthalate including dioctyl and dibutyl phthalates. The ratio of the polymer to the plasticizer is preferably about 3:1 to about 1:1 by weight. Such compositions are sufficiently flexible for processing in accordance with the present invention.

The developed photosensitive side of the composite confronts the surface of the substrate in the lamination. A typical laminating procedure includes pressures of about 100 to about 3,000 psi and temperatures of about normal room temperature to about 100° C.

After lamination, if desired, the backing or support can be separated from the laminated article. However, it is not entirely essential that such be separated at this stage since, if the proper materials are selected, the sintering step will result in volatilization and/or decomposition of the backing material. Preferably the backing or support is separated from the laminated article. The removal of the backing at this stage is especially important for providing patterns which are buried in the laminate such as in the case of multilayer structures.

It is essential to the practice of the present invention that the photosensitive material be exposed and developed prior to the lamination so that the green stage of the substrate is not exposed to the solvents necessary to develop the photosensitive material. Such exposure could have an undesirable effect upon the green stage material such as possible chemical reaction and/or being sorbed by the substrate. This, in turn, can cause undesirable distortion of the sintered product which would be a critical defect in the product.

The laminated article is then subjected to elevated temperatures which are sufficient to cause sintering of the ceramic particles and/or metallic particles and/or combinations thereof. Typical temperatures are about 900° to 1600° C. Likewise, the elevated temperatures cause volatilization or decomposition of the photosensitive material and backing, if still present. This, in turn, results in providing cavities in the sintered substrate which correspond to the developed photosensitive material.

Next, if desired, the cavities can be provided with metal to form conductive lines.

Figure 2:
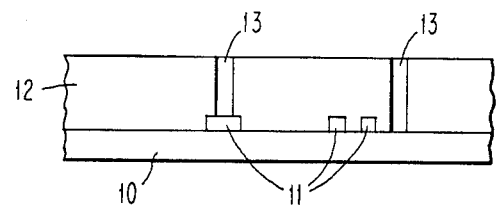

In order to further illustrate the present invention, reference is hereby made to the figures. In particular, FIG. 1 illustrates a backing or carrier or support 10 such as polyethylene terephthalate containing a predetermined pattern of developed photosensitive material 11. The developed photosensitive material 11 and backing 10 are laminated together with a ceramic substrate in the green stage whereby the side containing the developed photosensitive material confronts the ceramic 12 (see FIG. 2). The ceramic 12 contains vias 13 already punched therethrough. The vias 13 are filled with a combustible or fugitive paste 14 to prevent closing of the vias due to the lamination procedure. A typical paste 14 contains combustible particles such as terephthalic acid particles and an organic vehicle or carrier such as ethyl cellulose and butyl carbitol acetate to provide a workable viscosity (e.g. about 10,000 centipoise at room temperature).

Figure 3:
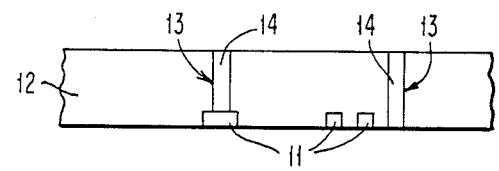

A typical lamination procedure employs a temperature of about 75° C. and pressure of about 1500 psi for about 5 minutes. As illustrated in FIG. 3, the backing 10 has been removed, resulting in the photosensitive material being embedded into the green sheet or substrate 12, which sheet is self-supporting.

Figure 4:
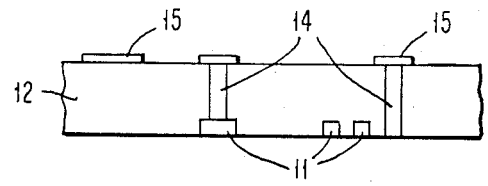

Next, optional top surface metallurgy 15, as illustrated in FIG. 4, is provided by well-known screening techniques.

Figure 5:
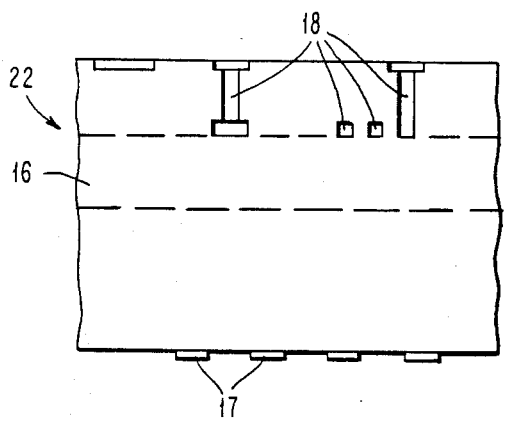

The layer 12 is then laminated with additional layers represented by numeral 16 having vias and cavities for lines (not shown) along with pads 17 for subsequent brazing of connection pins (see FIG. 5). The laminate is then sintered, whereby paste 14 is removed by decomposition and volatilization resulting in cavities 18, as well as removal of the photosensitive material 11, also resulting in cavities 18. The module, as represented by numeral 22, is thereby obtained.

Figure 6:
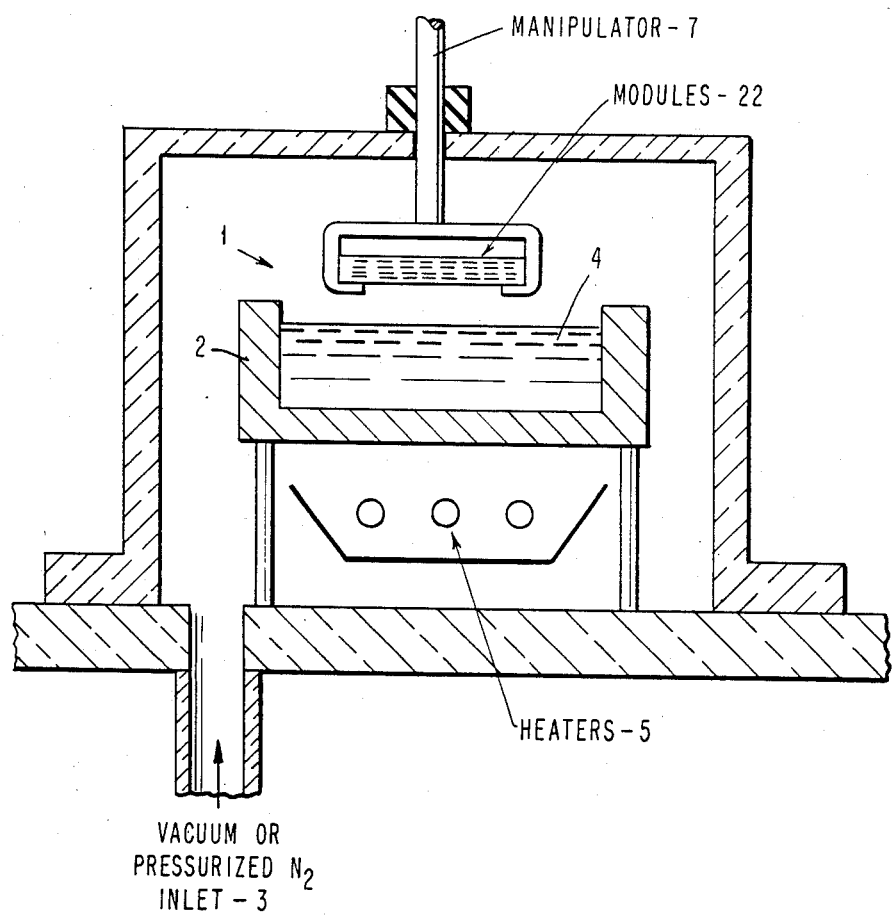
FIG. 6 is a schematic representation of apparatus suitable for impregnating a multilayer ceramic substrate with a conductive material.
Figure 7:
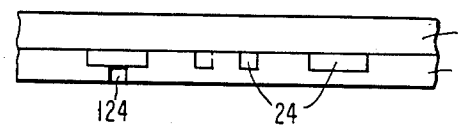
FIGS. 7–11 are cross-sectional views of multilayer ceramic substrate in various stages of fabrication in accordance with the process of the present invention.
Figure 8:
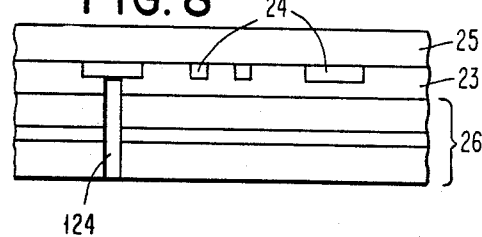

Conductive metal can be provided within lines or cavities 11 and other cavities beneath the surface of module 22 by a metal impregnation technique. For instance, reference is made to FIG. 6 which illustrates apparatus suitable for impregnating metal into the module beneath the surface. The procedure involves evacuating the pressure chamber 1 by applying a vacuum via conduit 3. Next, the desired modules 22 are immersed into molten metal 4 contained within metal container 2 by means 7. The chamber is then pressurized by injecting gas via conduit 3. The gas is an inert gas such as $N_2$. After the container is filled completely with the gas, about 1 to 10 minutes are usually required to force the liquid metal through the cavities in the module 22. The module is then removed from the molten metal. The modules are then cooled and then removed from the container 1. Numeral 5 represents heating means for heating up the metal and maintaining it molten during the immersion process. The above procedure illustrates a method for providing fan-out lines within a multilayer ceramic.

Another technique for metal filling of module 22 involves heating in vacuum, the prepared module or substrate 22 having solid metal placed against all openings to the exterior of the module or substrate 22. After the metal is rendered molten, pressure is applied to force the liquid or molten metal into the openings. This procedure avoids the immersion of the substrate in a container of molten metal.

The sintering of the ceramic particles of the substrate out of contact with the metal is advantageous since it eliminates any problem that could occur such as compatibility when attempting to fire or sinter the ceramic particles in the presence of the metals for the conductive lines. Also, this procedure provides greater flexibility in being able to fabricate a number of the same structures having the desired pattern with individual ones being provided with different metals for the conductive lines as may be desired for different applications.

Figure 9:
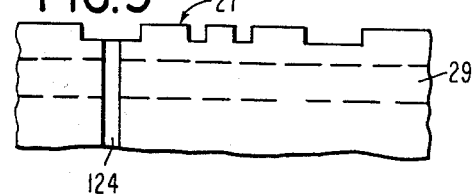
Figure 10:
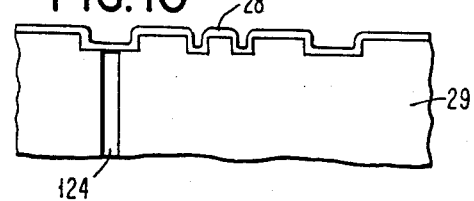
Figure 11:
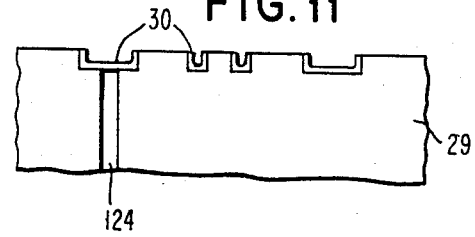

FIGS. 7-11 are cross-sectional views representing a device in various stages of fabrication for the formation of fan-out lines on a multilayer ceramic. In particular, in FIG. 7 a developed photosensitive material 24 and backing 25 are laminated to a ceramic green sheet 23 containing paste-filled vias 124. Metallized ceramic green sheets 26 can be prepared in accordance with prior art techniques including punching and filling vias 124 therein. The ceramic sheets 26 are laminated with the photosensitive pattern embedded into the green ceramic surface of sheet 23 (see FIG. 8). The module is then sized and fired, resulting in the embossed surface 27 on composite substrate 29, as illustrated in FIG. 9. The surface is then coated with the desired metal 28 such as Cr-Cu-Au, Al, or Cr-Ni-Au. Next, the surface is ground or lapped whereby the ceramic area provides the stopping place of the lapping leaving metallized pattern 30 on the surface thereof.

Figure 12:
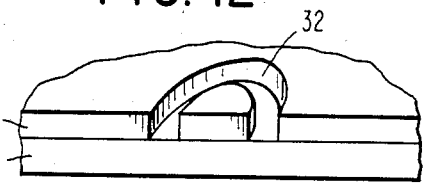
FIGS. 12–16 are cross-sectional views of a print head with dielectric isolation in various stages of fabrication prepared in accordance with the process of the present invention.
Figure 13:
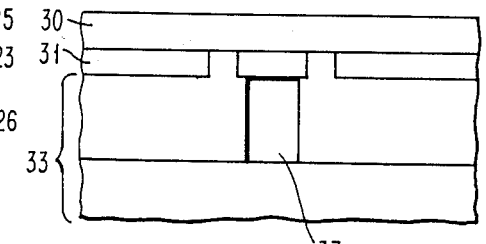
Figure 14:
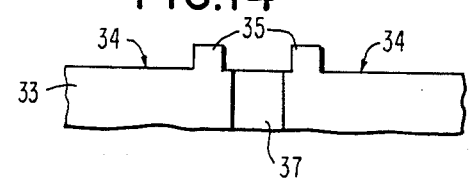
Figure 15:
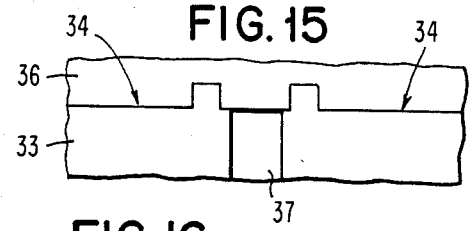
Figure 16:
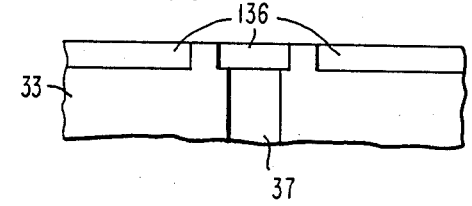

FIGS. 12-16 are cross-sectional views of a print head device in various stages of fabrication. FIG. 12 illustrates the desired top surface pattern 32, developed in a layer of photosensitive material 31 on a substrate of, for instance, polyethylene terephthalate 30. The composite is then laminated with metallized multilayer ceramic sheets 33 having interconnecting vias 37 from the printed dots to patterns within and on the bottom surface, as illustrated in FIG. 13. Also, if desired, vias can be connected to the top surface along the lines illustrated in the fabricating shown in FIG. 7. The desired pattern 35 in FIG. 14 from pattern sheet 30 is obtained by embossing with sheet 30 into the top surface 34 during lamination. After sintering, a $RuO_2$/glass slurry 36 is sprayed or painted onto the surface 34 and fired to provide a conductive $RuO_2$ 136 as shown in FIG. 15. The $RuO_2$ 136 is then lapped to the alumina plateaus which thereby completes the isolation of the segments of the conductive $RuO_2$/glass 136 as illustrated in FIG. 16.

What is claimed is:

1. A method for forming a pattern in a metallic or ceramic substrate which comprises:
   (a) providing a composite of a layer of photosensitive material on a backing;
   (b) exposing said layer of photosensitive material to actinic radiation in a predetermined pattern;

(c) developing said layer of photosensitive material to leave the predetermined pattern on said backing;

(d) then laminating together said composite and a substrate in the green stage containing metallic particles or ceramic particles or combinations thereof with the developed photosensitive side of the composite confronting the surface of said substrate, thereby embedding the predetermined patterns of photosensitive material into said substrate in said green stage; and (e) subjecting the substrate to elevated temperature sufficient to cause sintering of the particles in said substrate and removal of the photosensitive material, thereby resulting in embedding the said pattern into the sintered metallic or ceramic substrate.

2. The method of claim 1 wherein said substrate contains ceramic particles.

3. The method of claim 1 wherein the substrate contains a plurality of layers and each layer is about 4 to about 15 mils thick.

4. The method of claim 1 wherein the pattern includes lines with at least one of the width or length being 2 mils or less.

5. The method of claim 1 wherein the pattern includes lines with at least one of the width or length being 1 mil or less.

6. The method of claim 4 wherein said pattern includes fan-out lines in multilayer ceramic substrate.

7. The method of claim 4 wherein said pattern includes fan-out lines on multilayer ceramic substrate.

8. The method of claim 4 which includes lines and interconnecting vias within and on the multilayer ceramic substrate.

9. The method of claim 1 wherein said substrate in the green stage includes vias filled with a fugitive paste.

10. The method of claim 4 which is directed to providing dielectric isolation for print heads.

11. The method of claim 1 wherein the thickness of said photosensitive layer is about 0.5 to about 3 mils.

12. The method of claim 1 wherein said backing is transparent.

13. The method of claim 1 wherein said backing contains polyethylene terephthalate.

14. The method of claim 1 which further includes providing conductive material in said pattern.

15. The method of claim 14 which includes providing said conductive material in said pattern by impregnation with molten metal.

16. The method of claim 1 wherein said laminating is achieved at pressures of about 100 to about 3000 psi and temperatures of about normal room temperature to about 100° C.

17. The method of claim 1 wherein said laminating is achieved at a pressure of about 1500 psi at 75° C. for about 5 minutes.

18. The method of claim 1 wherein said elevated temperature is about 900° to 1600° C.

19. The method of claim 1 wherein said substrate in said green stage contains a thermally-fugitive bonding material for bonding by metallic particles, or ceramic particles, or combinations thereof.

20. The method of claim 19 wherein bonding material is an organic binder and said substrate in the green stage contains about 8% to about 25% by weight of said binder.

* * * * *